(12) United States Patent
Olschowsky et al.

(10) Patent No.: US 8,628,227 B2
(45) Date of Patent: Jan. 14, 2014

(54) DEVICE FOR ADJUSTING A BEAM PROFILE, LASER PROCESSING MACHINE AND METHOD FOR PRODUCING THE DEVICE

(71) Applicant: TRUMPF Laser GmbH + Co. KG, Schramberg (DE)

(72) Inventors: Peter Olschowsky, Schramberg (DE); Rudolf Huber, Aldingen-Aixheim (DE); Stefan Fuchs, Böhringen (DE)

(73) Assignee: TRUMPF Laser GmbH + Co. KG, Schramberg (DE)

( * ) Notice: Subject to any disclaimer, the term of this patent is extended or adjusted under 35 U.S.C. 154(b) by 0 days.

(21) Appl. No.: 13/668,751

(22) Filed: Nov. 5, 2012

(65) Prior Publication Data

US 2013/0114285 A1    May 9, 2013

(30) Foreign Application Priority Data

Nov. 7, 2011   (DE) .......................... 10 2011 085 840

(51) Int. Cl.
    *F21V 7/04*   (2006.01)
(52) U.S. Cl.
    USPC .............................. 362/553; 362/554; 385/54
(58) Field of Classification Search
    USPC ........................................................ 385/54
    See application file for complete search history.

(56) References Cited

U.S. PATENT DOCUMENTS

| 6,580,868 | B2 * | 6/2003 | Chen et al. ..................... 385/140 |
| 6,714,716 | B2 * | 3/2004 | Chen et al. ..................... 385/140 |
| 2006/0072877 | A1 | 4/2006 | Tanaka et al. |
| 2007/0147758 | A1 | 6/2007 | Cummings |
| 2009/0208170 | A1 | 8/2009 | Moriarty |
| 2010/0150201 | A1 * | 6/2010 | Shin et al. ..................... 372/101 |

FOREIGN PATENT DOCUMENTS

| DE | 3509421 A1 | 9/1985 |
| DE | 202004004817 U1 | 6/2004 |
| JP | 60068302 A | 4/1985 |
| KR | 1020100068694 A | 6/2010 |

OTHER PUBLICATIONS

German Office Action dated Jun. 29, 2012.
European Search Report dated Mar. 1, 2013.

* cited by examiner

*Primary Examiner* — Mary Ellen Bowman
(74) *Attorney, Agent, or Firm* — Michael D. Bednarek; Axinn Veltrop Harkrider LLP

(57) ABSTRACT

The invention relates to a device for adjusting a beam profile of a laser beam, which is guided in a light guide of a fiber optic cable provided with a protective sleeve, wherein the device comprises a deformation device for deforming the light guide in a section of the fiber optic cable not enclosed by the protective sleeve, a housing, which is designed to surround the light guide at least in the section not enclosed by the protective sleeve, and also two holders provided at opposite ends of the housing for fixing in each case one end of a section of the protective sleeve, wherein the holders each comprise an opening for feeding the light guide to the deformation device. The invention also relates to a laser processing machine having such a device and to an associated production method.

10 Claims, 4 Drawing Sheets

DEVICE FOR ADJUSTING A BEAM PROFILE, LASER PROCESSING MACHINE AND METHOD FOR PRODUCING THE DEVICE

FIELD OF THE INVENTION

The present invention relates to a device for adjusting a beam profile, a laser processing machine having such a device, and to a method for producing such a device.

BACKGROUND OF THE INVENTION

If light from a beam source is coupled into one end of a light guide, the beam profile at the other end of the light guide is determined not only by the beam source but also by the homogenisation properties of the light guide. The near field power distribution desired for a laser processing machine at the output end of the light guide can take the shape (in a radial direction) of, for example, a mountain peak (conical tip with marked intensity maximum at the beam centre) or a flat-top mountain peak, (cylindrical shape, i.e. plateau of substantially constant intensity, "top-hat"). By setting a beam profile with a marked intensity maximum at the beam centre, the welding penetration depth in a laser welding process can be increased. By setting a top-hat profile on the other hand, a wide seam and hence a larger joint width between the two workpieces to be welded can be achieved.

US 2010/0150201 A1 describes the coupling of laser radiation of a fibre bundle into a single fibre of a fibre optic cable. For better alignment of the fibres relative to the radiation entering therein, a mode mixer is used, which comprises a means for altering the curvature of the fibre optic cable. It is intended to achieve a homogenisation of the energy density of the laser beam by winding the fibre optic cable in loops.

KR 10-2010-0068694 (Kim Jom Sool) discloses a device in which a section of a fibre optic cable is bent in order to achieve a uniform brightness distribution of a laser beam guided in the fibre optic cable. For that purpose the fibre optic cable is fixed at two points to a fixing plate and a movement device arranged therebetween displaces the section of the fibre optic cable running between said two points in order to adjust the curvature of the fibre optic cable.

In order to protect light guides against damage from external influences, they are surrounded inter alia by a protective tube and form a fibre optic cable. The protective tube serves to withstand tensile, bending and transverse compressive stresses of the fibre optic cable. In particular when the light guide is used for transporting a high power laser beam, the protective tube should also ensure that no forces leading to a distortion or deformation of the light guide are able to act on the light guide. Such a protective tube is known, for example, from DE 20 2004 004 817 U1. The protective tube described therein has a high stiffness so that it can be bent only as far as a minimal bend radius of 150 mm, at which no damaging forces act on the light guide with the light guide diameters used there.

SUMMARY OF THE INVENTION

The present invention addresses the problem of specifying a device for adjusting a beam profile, which on the one hand permits a flexible beam forming and on the other hand protects the light guide satisfactorily against damage due to external influences.

This problem is solved according to the invention by a device for adjusting a beam profile of a laser beam, which is guided in a light guide of a fibre optic cable (also called a laser light cable, LLK) having a protective sleeve, wherein the device comprises: a deformation device for deforming the light guide in a section of the fibre optic cable not enclosed by the protective sleeve, a housing, which is designed to surround the light guide at least in the section not enclosed by the protective sleeve, and two holders provided at opposite ends of the housing for fixing in each case one end of a section of the protective sleeve, wherein the holders each comprise an opening for feeding the light guide to the deformation device.

The adjustment of the beam profile is effected in the case of the device according to the invention by the application of a force, e.g. by bending, a section of the light guide not enclosed by the protective sleeve, whereby bend radii that are smaller than in the sections in which the light guide is enclosed by a protective sleeve can be achieved. At the same time, the arrangement inside the housing of the section that is not enclosed by the protective sleeve ensures that the light guide is protected also in said region against external influences. The protective sleeve provided outside the housing prevents forces that interfere with the transport of the high power laser radiation from being able to act on the light guide outside the housing. By means of the device according to the invention the protective sleeve of the fibre optic cable can be fixed in the holders, whilst the section of the light guide not enclosed by the protective sleeve is fed to the deformation device and deformed there.

Preferably, the deformation device has a passage for passage of the light guide, which passage is movable transversely to the holders. The holders for fixing the protective sleeve are spaced apart from each other in the longitudinal direction of the fed-in light guide and the deformation device is arranged between the two holders, which may consist of a plurality of components which are fixed in their position relative to one another. The holders are preferably aligned along a common axis. The movement of the passage is effected in this case typically in a plane perpendicular to this common axis. By moving the passage relative to the holders, the light guide fed through the passage of the deformation device can be bent, since the holders are rigidly connected to one another via the housing. The deformation device can be designed to effect a linear displacement of the passage relative to the holders and in this manner bend the light guide. As an alternative to bending the light guide, the deformation device can also be designed to alter the beam profile by torsion of the light guide or by exerting pressure on the outer surface of the light guide.

An especially preferred embodiment provides for the deformation device to be rotatable relative to the holders about an axis of rotation that is offset with respect to a feed axis formed by the openings in the holders, i.e. is spaced from the feed axis. The openings, which in particular can be in the form of feed channels, define the feed axis. The axis of rotation and the feed axis typically run parallel to one another. The degree of deformation or bending of the light guide can in this case be adjusted via the angle of rotation of the deformation device, wherein the adjustment is typically effected continuously and at exactly one rotated angle (starting position) the light guide is fed without any bending through the deformation device. A good homogenisation of the output (top-hat profile) can be achieved, for example, by a U-shaped or S-shaped bending of the light guide. A U-shaped bending is understood to be a bending in which the light guide comes, for example, from the left, is bent downwards, runs back again in a U-shape and then continues to the right.

In a development of the invention, the deformation device is in the form of a hollow cylinder, which has an eccentric bore as the passage. The passage, or rather the bore, runs eccentrically with respect to the centre line of the hollow cylinder that forms the axis of rotation, so that the hollow cylinder embodies a simple form of a cam. The hollow cylinder can in particular comprise two bore portions tapering towards the passage in order to facilitate feeding of the light guide through the passage.

In order to permit an easy and convenient operation, it is advantageous if the deformation device comprises a control element that extends through an opening in the housing and can be operated from outside the housing. The control element is preferably rigidly connected to the deformation device, so that a movement of the control element is converted directly into a movement of the deformation device. The control element can be, for example, a pin, which is guided through an opening in the housing, for example, in the form of a slot extending over a specific angular range, and can be turned along this opening relative to the housing, wherein the rotational movement can be effected, for example, over an angular range of at most 180°. In order to seal the opening or the slot with respect to the surroundings, and to permit an additional guidance of the control element, a covering, for example, a collar-like covering, can be provided on the exterior of the housing and can be rigidly connected to the control element. It goes without saying that a scale, e.g. an angle scale, can be provided on the exterior of the housing and/or on the covering in order to indicate the degree of deformation or bending of the light guide.

In a preferred embodiment, the deformation device is designed to bend the light guide in the section of the fibre optic cable with no sleeve up to a minimum bend radius of 40 mm, preferably 25 mm, especially preferably 10 mm, in order in this manner to permit a significant change of the beam profile. The radii of curvature specified here can be effected typically not by bending a fibre optic cable, in which the light guide is enclosed by the protective sleeve, since the covering is intended to prevent too great a bending of the light guide. The (minimum) bend radius required for an ideal beam profile adjustment also depends on the diameter of the light guide (e.g. quartz fibre). The values specified here are typical for a diameter of more than about 600 μm. In the case of smaller diameters (e.g. of more than about 100 μm), correspondingly smaller (minimal) bend radii are normally used.

A preferred embodiment of the device comprises a fibre optic cable, the light guide of which is guided through the holders and the deformation device arranged therebetween, wherein the protective sleeve comprises two sections, which enclose respective sections of the light guide outside the deformation device, wherein the end of each section facing the deformation device is fixed in a respective one of the holders. The sections of the protective sleeve (part-sleeves) protect the light guide against damage in the region outside the deformation device and are fixed in the holders, e.g. are pushed therein, so that the protective sleeve is prevented from slipping off the light guide. Inside the deformation device meanwhile, the desired beam profile adjustment can be made, irrespective of the properties of the protective sleeve. A seal, e.g. in the form of an O-ring, which surrounds the outer surface of the protective sleeve fixed in the holders, can optionally be mounted in the region of the holders. It goes without saying that each section of the protective sleeve can also comprise a plurality of part-sleeves nested one inside the other, e.g. a radially inner part-sleeve which is surrounded by a radially outer part-sleeve.

Fibre optic cables that are used for transporting laser radiation from a laser source to a laser processing head in a laser processing machine are generally provided with a protective sleeve that prevents a bending of the light guide with a bend radius of less than 200 mm or less than 150 mm. A beam profile adjustment of the desired quality is not generally possible with such bend radii, so that a bending of the light guide relative to the protective sleeve in the above-described manner is required.

The invention also relates to a laser processing machine having a device as described above, in which the fibre optic cable is typically used for transport of laser radiation from a laser source to a laser processing head.

A further aspect of the invention relates to a method for producing the above-described device, comprising the following steps: feeding the light guide of the fibre optic cable through the passage of the deformation device, providing the light guide with a section of the protective sleeve at each of the opposite ends of the housing and fixing one end of each section in a respective one of the holders. In this manner a device can be provided in which the light guide, at least in the region of the deformation device, is not enclosed by a protective sleeve.

Further advantages of the invention are apparent from the description and the drawings. Features mentioned above and hereafter can likewise be used alone or in any combination. The exemplary embodiments illustrated and described are not to be understood as an exhaustive list but are merely of an exemplary nature for explanation of the invention.

DETAILED DESCRIPTION

Figure 1:
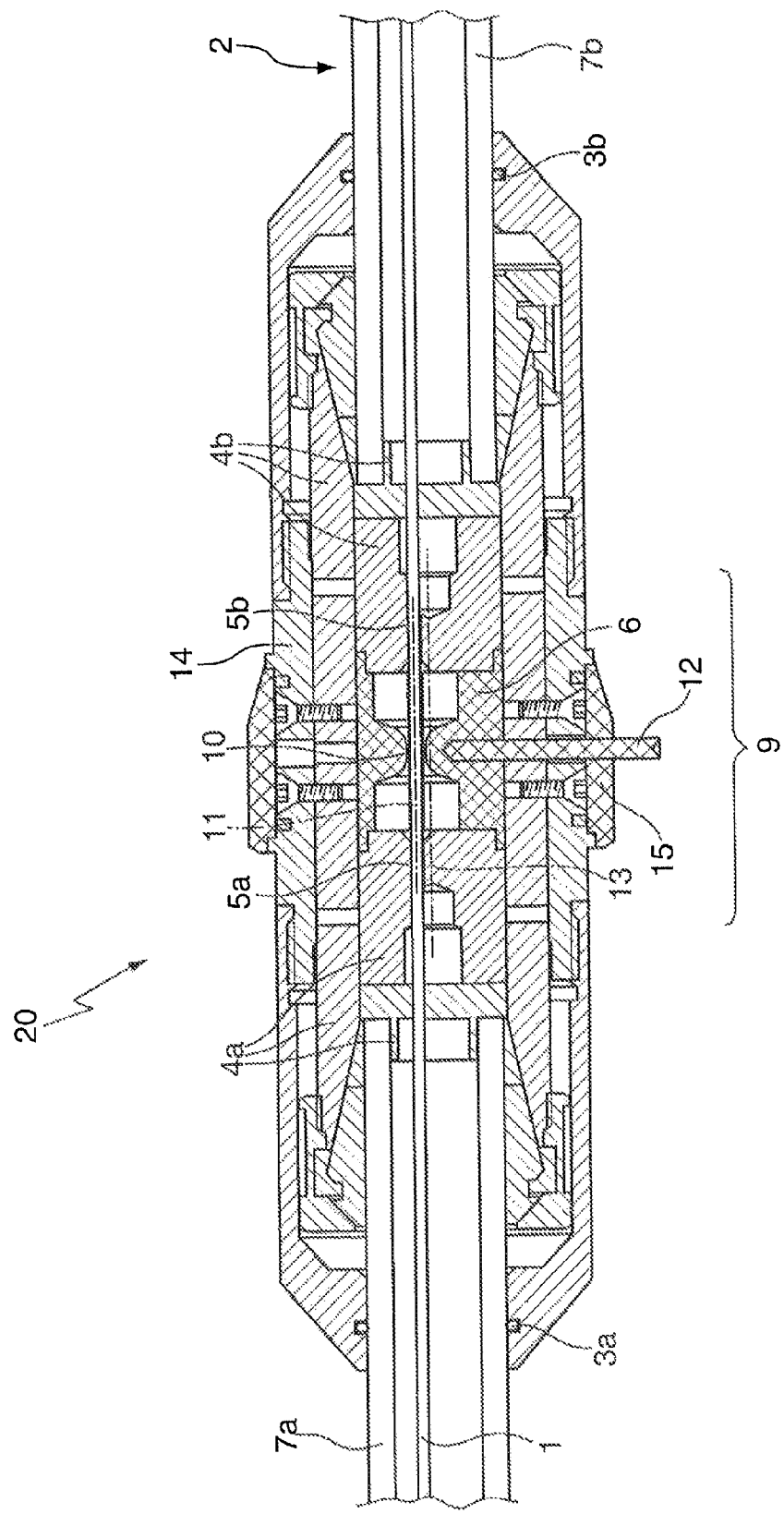
FIG. 1 shows a sectional view of a device for beam profile adjustment comprising a deformation device in a first angular position, in which a light guide is fed, without being bent, through a passage in the deformation device.
Figure 2:
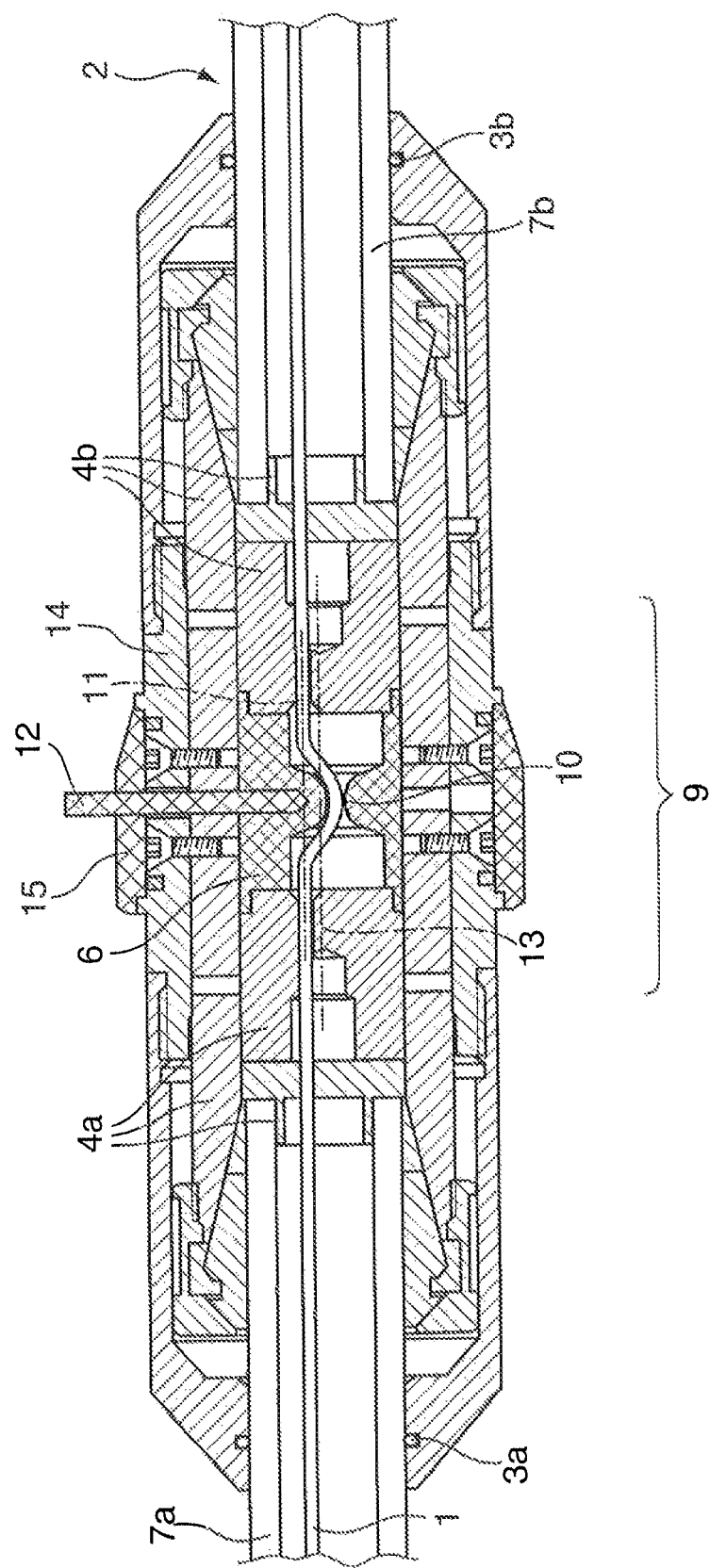
FIG. 2 shows a sectional view of the device for beam profile adjustment comprising a deformation device in a second angular position, in which the light guide has a curvature in the region of the passage.

FIGS. 1 and 2 show a device 20 for beam profile adjustment of a laser beam (not shown), which is guided in a light guide 1 of a fibre optic cable 2, in two different angular positions of a deformation device 6, which in the present example is designed to bend the light guide 1 and which has a passage 10 for the light guide 1.

A housing 14 surrounds the region of the deformation device 6 and also two holders 4a, 4b, through which the light guide 1 of the deformation device 6 can be fed, by introducing the light guide 1 into the first holder 4a at the angular position of the deformation device shown in FIG. 1. The light guide 1 is here fed via a first opening 5a of the first holder 4a to the passage 10 of the deformation device 6. The light guide 1 passes via a second opening 5b in the second holder 4b and is led out of the housing 14 at the second holder 4b. In the angular position of the deformation device 6 shown in FIG. 1, the openings 5a, 5b of the holders 4a, 4b and the passage 10 are arranged along a common feed axis 11, so that the light guide 1 can be passed without problems through the openings 4a, 4b and the passage 10 of the deformation device 6. The deformation device 6 in the present example is in the form of a circular cylinder with an eccentric bore in the form of a double funnel, the minimum diameter of which forms the passage 10.

The fibre optic cable 2 comprises in the present example a protective sleeve 7a, 7b, which annularly surrounds the light guide 1 and protects it against external influences, in particular damage and undue bending. The protective sleeve comprises two sections 7a, 7b which, after the light guide 1 has been introduced into the deformation device 6, are pushed over the ends of the light guide 1. The ends of the sections 7a, 7b facing the housing 14 are secured in the holders 4a, 4b, in the present example, are firmly clamped therein. In order to provide a seal against the surroundings, seals 3a and 3b in the form of O-rings are provided on the holders 4a and 4b respectively. Since the sections or part-sleeves 7a, 7b terminate at or at least in portions in the holders 4a, 4b, the fibre optic cable 2 has a section 9 between the holders 4a, 4b with no sleeve, in which the deformation device 6 is provided. Both the section 9 of the light guide 1 with no sleeve and also the transitions from the section 9 with no sleeve to the sections 7a, 7b of the protective sleeve is protected against external influences by the housing 14.

By means of a control element 12, which in the example shown is rigidly connected to the deformation device 6, the deformation device 6 can be rotated about an axis of rotation 13 that forms the axis of symmetry of the cylindrical deformation device 6 and of the housing 14. The rotation of the deformation device 6 can also be effected in a different manner e.g. by means of a screw or a motor. The deformation device 6 can be rotated by means of the control element 12 into a second angular position, which is shown in FIG. 2 and in which the deformation device 6 has been rotated into an angular position rotated through 180° with respect to the angular position shown in FIG. 1. Since the passage 10 is arranged eccentrically with respect to the axis of rotation 13, when the deformation device 6 is rotated the passage 10 moves along a circular path perpendicular to the axis of rotation 13. Although the passage 10 still runs parallel to the feed axis 11 here, it is spaced apart therefrom. As a result, the section 9 of the light guide 1 that is located inside the deformation device 6 is bent, as shown in FIG. 2. By actuating the control element 12, the light guide 1 can therefore be brought out of the extended position into a bent or curved position, the curvature of the light guide 1 increasing as the distance between the feed axis 11 and the passage 10 increases. In the angular position shown in FIG. 2, this distance is the maximum distance. The dimensions of the housing 14 and in particular the distance between the feed axis 11 and the axis of rotation 13 and the length of the passage 10 are here selected so that in this angular position a (minimum) bend radius of 40 mm, preferably of 25 mm, in particular of 10 mm, can be achieved.

Due to the bending of the light guide 1 a compressive stress is generated on the part of the light guide 1 disposed inwardly with respect to the bend, i.e. on the part of the U-shaped section 9 of the light guide 1 facing upwards in FIG. 2, whereas a tensile stress is generated on the opposite part of the U-shaped section on the outside with respect to the bend. These differences in stress can cause e.g. a change in the refractive index within the light guide 1, so that the change in the degree of bending (change in the radius of curvature) causes a change of the beam profile. In this manner the beam profile of the laser beam guided in the light guide 1 can be matched to a desired application. The more marked the curvature (that is, the smaller the bend radius), the more closely the beam profile can be approximated to a top-hat profile.

Using the deformation device 6 shown in FIG. 1 and FIG. 2 the light guide 1 can be brought into a shape of which the curvature undergoes a sign change twice. It is also possible, however, using a correspondingly designed deformation device 1, to effect more than two curvature changes, in order to optimise the beam profile. Alternatively or additionally to bending the light guide 1, the deformation device 6 can also be designed to twist the light guide 1 or to exert pressure on the (unbent) light guide 1). This measure also alters the refractive index of the light guide 1 in the region of the deformation, which can be used for an adjustment of the beam profile.

It goes without saying that the device 20 described here can also be used with fibre optic cables that have merely a single protective sleeve or more than two protective sleeves nested one inside another. The holders then have to have a corresponding number of fixing devices for the particular protective sleeve. The protective sleeve can be constructed as described, for example, in DE 20 2004 004 817 U1. It serves only to provide mechanical stability, and has no beam-guiding action. The minimum bend radius of the light guide 1 that can be achieved with the protective sleeve 7a, 7b is approximately 150 mm, and is therefore considerably larger than the bend radii that can be produced at the section 9 of the light guide 1 not enclosed by the protective sleeve 7a, 7b.

Figure 3:
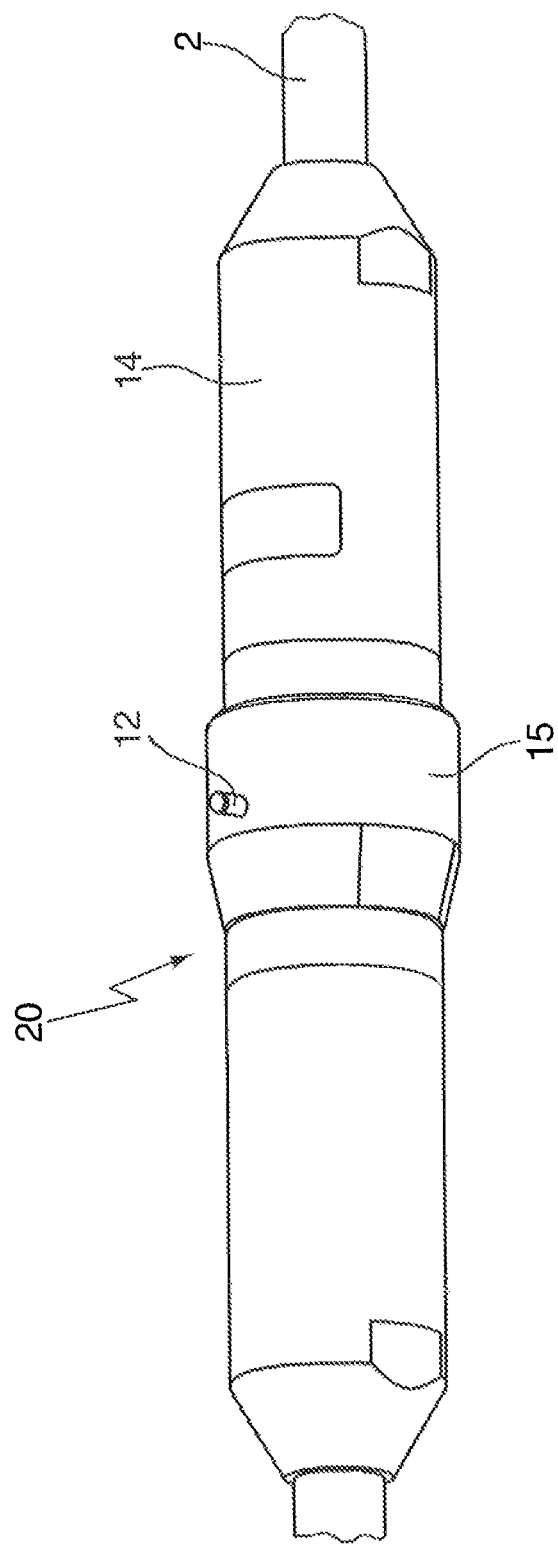
FIG. 3 shows an exterior view of the device of FIG. 1 and FIG. 2.

FIG. 3 shows an exterior view of the beam-forming device 20 of FIG. 1 and FIG. 2. The control element 12 is in the form of a pin, which is connected to a collar 15 mounted on the exterior of the housing 14, so that a rotation of the deformation device 6 can be achieved by applying force to the pin 12 and/or to the collar 15. The collar 15 also serves as a covering for a slot-shaped opening in the housing 14 (see FIG. 1 and FIG. 2) through which the pin 12 is guided and which in the present example extends over an angular range of 180° For a reproducible beam profile adjustment, the collar 15 or the housing 14 can be provided with an (angle) scale and can function as a setting wheel.

Figure 4:
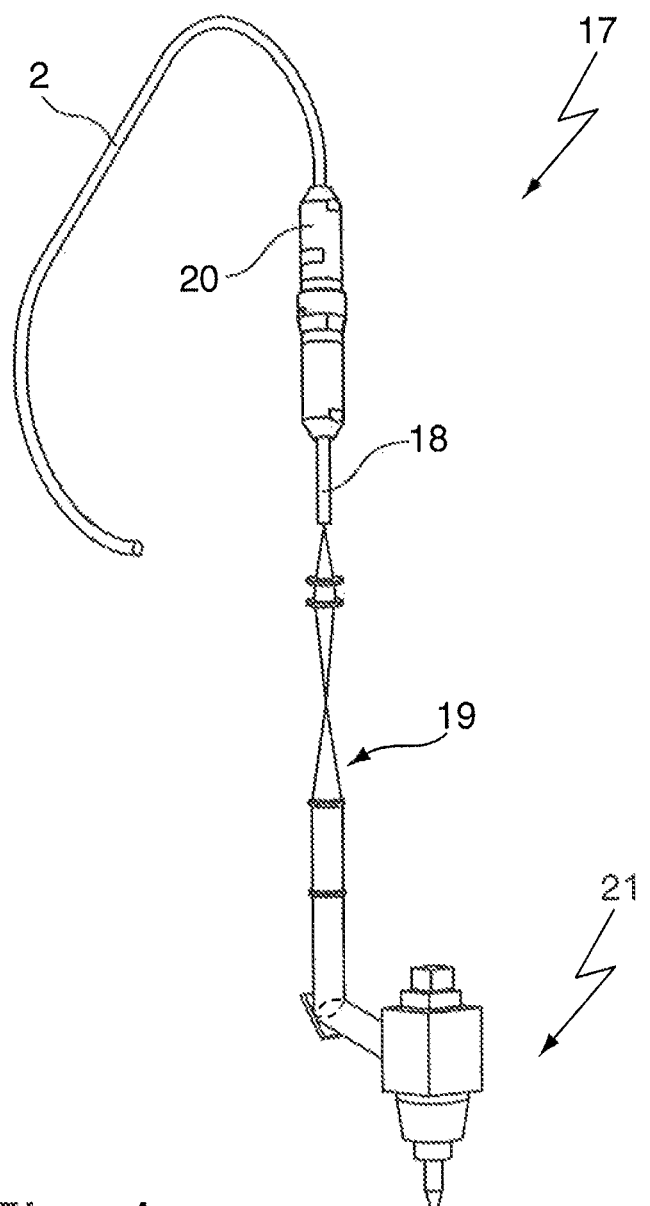
FIG. 4 shows a laser processing machine with a device for beam profile adjustment according to FIG. 1 to FIG. 3.

FIG. 4 shows part of a laser processing machine 17 with a device 20 according to FIGS. 1-3 for adjusting the beam profile, in which the laser radiation is fed from a laser beam source (not shown) by means of the fibre optic cable 2 to a beam guide 19 for free propagation of the laser beam 18. The beam guide feeds the laser beam 18, which has been imparted the desired beam profile in the device 20, to a laser processing head 21. By means of the device 20 the shape of the intensity distribution of the laser beam 18 can be adjusted depending on the type of laser processing to be carried out.

All in all, the above-described device 20 permits a reliable transport of laser radiation by means of a fibre optic cable 2, the laser radiation having a beam profile that is adjustable substantially independently of the beam source.

What is claimed is:

1. A device for adjusting a beam profile of a laser beam, which is guided in a light guide of a fibre optic cable provided with a protective sleeve, wherein the device comprises:
    a deformation device for deforming the light guide in a section of the fibre optic cable not enclosed by the protective sleeve,
    a housing, which is designed to surround the light guide at least in the section not enclosed by the protective sleeve, and
    two holders provided at opposite ends of the housing for fixing in each case one end of a section of the protective sleeve, wherein the holders each comprise an opening for feeding the light guide to the deformation device.

2. A device according to claim 1, in which the deformation device has a passage for the light guide to pass through, which passage is movable transversely to the holders.

3. A device according to claim 2, in which the deformation device is rotatable relative to the holders about an axis of rotation that is offset with respect to a feed axis formed by the openings in the holders.

4. A device according to claim 3, in which the deformation device is in the form of a hollow cylinder, which has an eccentric bore as the passage.

5. A device according to claim 1, in which the deformation device comprises a control element which is guided through an opening in the housing and can be operated from outside the housing.

6. A device according to claim 1, in which the deformation device is designed to bend the light guide in the section of the fibre optic cable with no sleeve up to a minimum bend radius of 40 mm, preferably 25 mm, in particular 10 mm.

7. A device according to claim 1, further comprising:
a fibre optic cable, the light guide of which is guided through the holders and the deformation device arranged therebetween, wherein the protective sleeve comprises two sections, which enclose respective sections of the light guide outside the deformation device, wherein the end of each section facing the deformation device is fixed in a respective one of the holders.

8. A device according to claim 7, in which the protective sleeve is designed on bending not to go below a minimum bend radius of 150 mm.

9. A laser processing machine having a device according to claim 7.

10. A method for producing a device according to claim 7, comprising the following steps:
feeding the light guide of the fibre optic cable through the passage of the deformation device,
providing the light guide with a section of the protective sleeve at each of the opposite ends of the housing and
fixing one end of each section in a respective one of the holders formed at the opposite ends of the housing.

* * * * *